US006977430B2

(12) United States Patent
Nowak

(10) Patent No.: US 6,977,430 B2
(45) Date of Patent: Dec. 20, 2005

(54) TRANSISTOR MODULE

(75) Inventor: Stefan Nowak, Erlangen (DE)

(73) Assignee: Siemens Aktiengesellshaft, Munich (DE)

( * ) Notice: Subject to any disclaimer, the term of this patent is extended or adjusted under 35 U.S.C. 154(b) by 0 days.

(21) Appl. No.: 10/895,715

(22) Filed: Jul. 21, 2004

(65) Prior Publication Data
US 2005/0023673 A1 Feb. 3, 2005

(30) Foreign Application Priority Data
Jul. 25, 2003 (DE) ................................ 103 34 079

(51) Int. Cl.⁷ ........................ H01L 23/52; H01L 23/48; H01L 23/34
(52) U.S. Cl. ........................ 257/691; 257/690; 257/724
(58) Field of Search .............................. 257/690–693, 257/723–724, 734

(56) References Cited

U.S. PATENT DOCUMENTS

| | | | |
|---|---|---|---|
| 4,470,095 A | | 9/1984 | Donig |
| 4,668,904 A | | 5/1987 | Kupiainen |
| 5,616,955 A | * | 4/1997 | Yamada et al. ............. 257/690 |
| 5,701,076 A | | 12/1997 | Schmitt et al. |
| 5,895,974 A | * | 4/1999 | Eytcheson et al. .......... 257/723 |
| 6,822,338 B2 | * | 11/2004 | Aono et al. ................. 257/690 |

OTHER PUBLICATIONS

Kolar et al., "Design and experimental investigation of a three-phase high power density high efficiency unity power factor . . . ", p. 514-523.
Gutsmann, B. et al., "Exact inductive parasitic extraction for analysis of IGBT parallel switching . . . ", p. 12291-1295.

* cited by examiner

Primary Examiner—Cuong Nguyen
(74) Attorney, Agent, or Firm—Brinks Hofer Gilson & Lione

(57) ABSTRACT

A transistor module formed on a substrate comprises a first transistor, a first recovery diode, a second transistor and a second recovery diode. A first transistor chip associated with the first transistor and a second diode chip associated with the second recovery diode are disposed adjacently on a positive potential area. The first transistor chip and the second diode chip are disposed on an output potential area. A second transistor chip associated with the second transistor and a first diode chip associated with the first recovery diode are adjacently disposed on the output potential area. At least two sides of the output potential area are adjacent to a negative potential area. Both the second transistor chip and the first diode chip are connected to the negative potential area, and one of the first and second transistor chips is disposed opposite one of the first and second diode chips located on a different potential area.

12 Claims, 3 Drawing Sheets

TRANSISTOR MODULE

BACKGROUND

The invention relates, in general, to transistor modules, and in particular to a transistor module having a first transistor and a first recovery diode and having a second transistor and a second recovery diode.

From German Patent Disclosure DE 31 12 280 A1, a transistor module for coil excitation is known, which is intended in particular for medical equipment systems which require power supplies that generate pulse-like fields of constant intensity. An exciter current of a coil should be run up to speed within a very short time and then be kept at a constant level until the end of the pulse.

From German Patent DE 34 15 041 C2, a power supply circuit is provided for gradient coils of a magnetic resonance imaging system for making medical diagnoses. To increase the energy conversion rate within the gradient coil, energy storing devices, such as capacitors, are disposed in series with the power supply circuit and with the current source.

From German Patent DE 195 11 833 C2, a gradient current supply for a magnetic resonance imaging (MRI) system is known which includes a plurality of transistors and recovery diodes in a bridge circuit connected to a gradient amplifier. Gradient pulses to be employed are predetermined by a sequence controller to which the gradient amplifier is connected. The layout of the circuit is not the subject of DE 195 11 833 C2.

SUMMARY

The present invention is defined by the appended claims. This description summarizes some aspects of the present embodiments and should not be used to limit the claims.

A transistor module has two transistors as well as two recovery diodes associated with the transistors. The transistor module has a relatively simple construction or layout suitable, because of a low stray inductance, for a gradient amplifier with steep gradient ramps, intended for example for medical equipment applications.

This transistor module is provided with two transistor chips, each with at least one transistor, and two diode chips, each with at least one recovery diode associated with one of the transistors. A circuit substrate, which is typically rectangular and on which the chips are individually disposed, has three potential areas, namely one positive potential area, one negative potential area, and one output potential area.

Both the first transistor chip and the second diode chip, having the corresponding second recovery diode associated with the second transistor chip, are disposed on the positive potential area.

Both the second transistor chip and the first diode chip having the first recovery diode, i.e. the recovery diode associated with the first transistor chip, are disposed on the output potential area, which is connected electrically, in general with tiny bond wires, to the chips disposed on the positive potential area.

As such, each transistor chip is disposed both adjacent to the diode chip disposed on the same potential area and opposite the diode chip disposed on a different potential area. Within this component layout, the "adjacent" disposition of two components, in this case a diode chip and a transistor chip, is used to mean an arrangement on the same potential area, while the "opposite" disposition of two components is used to mean an arrangement on different potential areas.

With generally rectangular chips, the two diode chips are disposed adjacent to and opposite, respectively, two lateral lines of one transistor chip that are perpendicular to one another. Thus, the transistor chips and diode chips are disposed in a cross-shaped pattern on the circuit substrate.

The negative potential area of the transistor module is embodied either as a cohesive surface or in the form of a plurality of partial areas. In each case, the negative potential area, or portions of this surface, is adjacent to at least two sides, preferably opposite sides, of the output potential area, which generally has a rectangular basic shape. As such, one may electrically connect the chips, disposed on the output potential area, to the negative potential area using especially short lines, and these short lines may preferably extend at least approximately perpendicular to the lines which connect the output potential area to the chips disposed on the positive potential area.

While the positive potential area is located in a plane defined by the circuit substrate, the negative potential area may have a more-complex form. On the one hand, the negative potential area is defined by its partial areas bordering on the output potential area and on the other hand by the lines leading from these partial areas to the chips on the output potential area. Preferably, a plurality of lines is provided such that the plurality of lines is used to connect the chips on the output potential area to the negative potential area. Because of the plurality of lines, preferably embodied as tiny bond wires disposed at least approximately parallel to one another, a continuous surface, which preferably at least approximately spans the output potential area, is approximated.

The area of negative potential, like the positive potential area, preferably has a substantially un-branched shape, in particular a rectangular shape, and both potential areas form large surfaces located close together. As a result, magnetic fields cancel each other out over a relatively wide range.

As such, a relatively low-inductance construction of the circuit arrangement is achieved, which is A gradient amplifier with steep gradient ramps, for instance with rise and fall times on the order of magnitude of 100 µs or below, may use the circuit.

The individual chips on the circuit substrate are preferably closely spaced apart from one another such that both a spacing of one transistor chip from the diode chip having the associated recovery diode and the spacing of the transistor chip from the diode chip having the recovery diode of the other transistor chip is less than the height or width of the transistor chip. A spacing between the positive potential area and the output potential area is preferably less than the height of a diode chip.

In a preferred embodiment, the negative potential area—aside from the tiny bond wires—has a U shape, and the middle beam of the U is disposed as a connecting cross-member between the positive potential area and output potential area. A connection of two outer partial faces of the negative potential area, which border the output potential area, via the connecting cross-member is relatively advantageous for electrically connecting a plurality of transistor modules that are disposed side by side in a circuit arrangement.

In another preferred embodiment, the output potential area is substantially adjacent the positive potential area. The negative potential area may be embodied in multiple parts, including merely individual connecting pieces. This multiple parts embodiment is suitable for applications in which a single transistor module is connected separately to the negative potential.

For manufacturing, the positive potential area and the output potential area are preferably disposed in the same plane on the circuit substrate. Collectors of the transistor chips and cathodes of the diode chips are soldered to the faces of the positive and output potential areas.

Illustrative and exemplary embodiments of the invention are described in further detail below with reference to and in conjunction with the figures.

DETAILED DESCRIPTION

Figure 1A:
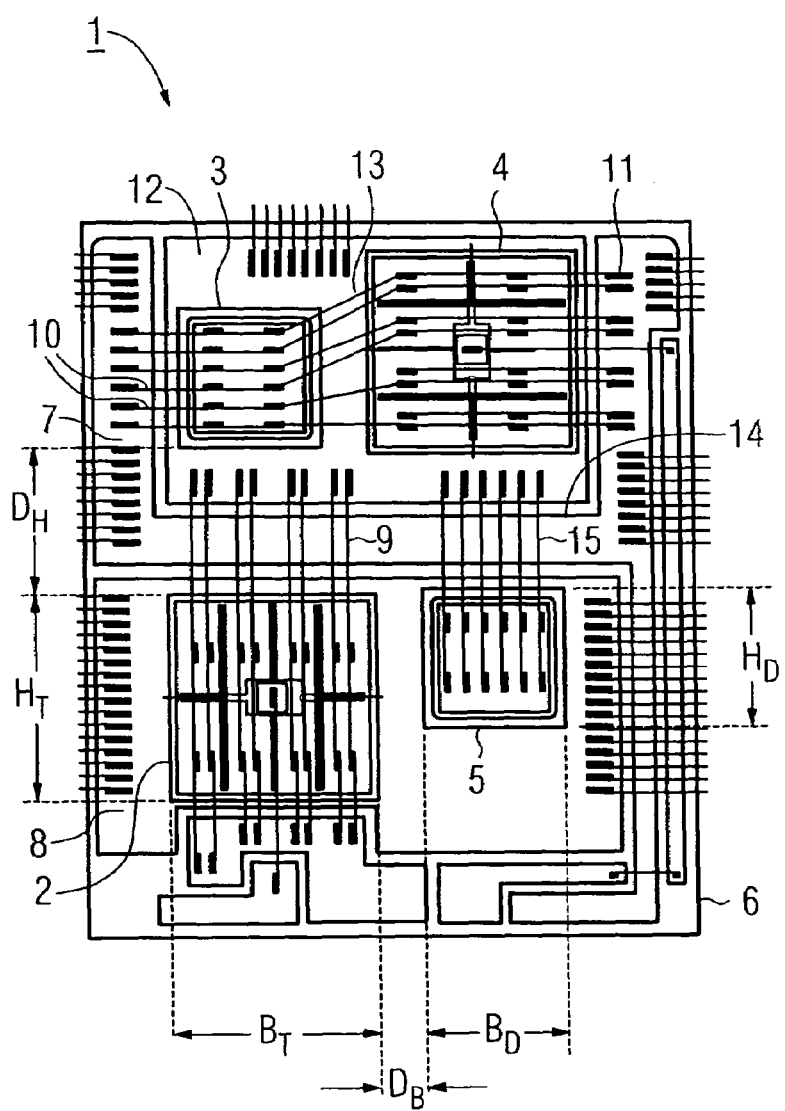
FIGS. 1a and 1b are schematics illustrating an embodiment of a transistor module of a gradient amplifier.

While the present invention may be embodied in various forms, there is shown in the drawings and will hereinafter be described some exemplary and non-limiting embodiments, with the understanding that the present disclosure is to be considered exemplifications of the invention and is not intended to limit the invention to the specific embodiments illustrated.

In this application, the use of the disjunctive is intended to include the conjunctive. The use of definite or indefinite articles is not intended to indicate cardinality. In particular, a reference to "the" object or "a" object is intended to denote also one of a possible plurality of such objects.

Similar elements are identified by the same reference numerals throughout the drawings.

Figure 1B:
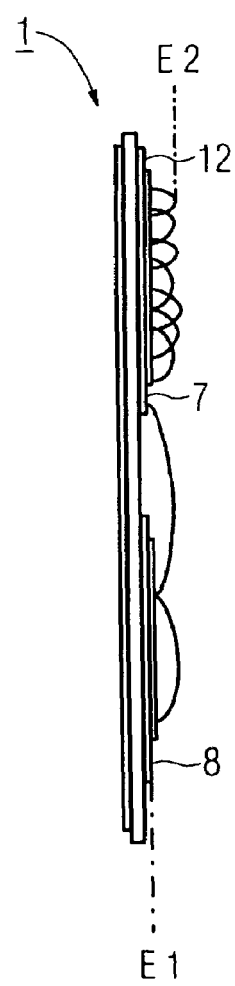
Figure 2:
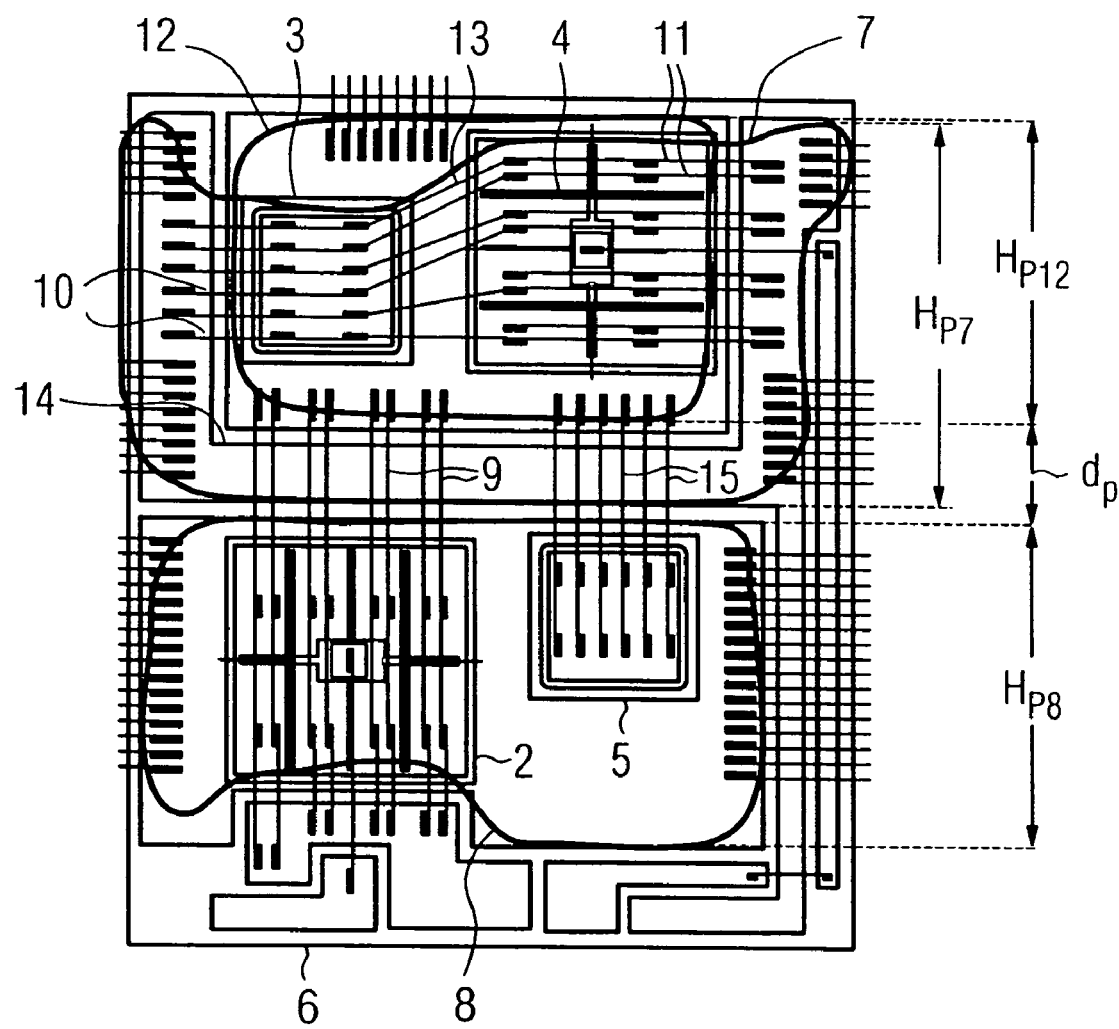
FIG. 2 is a schematic illustrating the transistor module of FIGS. 1a and 1b with schematically shown potential areas.

FIGS. 1a, 1b and 2 each show, in simplified form, an embodiment of a transistor module 1 of a gradient amplifier for medical equipment, in particular for an MRI system. The transistor module 1 is embodied on a circuit which is also known as a half bridge and has both two transistor chips 2, 4 and two diode chips 3, 5. In this embodiment, one individual transistor forms a transistor chip 2, 4 and one individual diode forms a diode chip 3, 5. A capacitor, not shown, is connected on the one hand, near the bottom in the drawings, to a positive potential area 8, and on the other, near the top in the drawings, to a negative potential area 7. Both potential areas 7, 8 are formed by a copper layer on a rectangular circuit substrate 6 and are located in a plane E1 (FIG. 1b, side view).

A collector of the first transistor chip 2 is soldered to the positive potential area 8. The emitter of the first transistor chip 2 is connected by a plurality of tiny bond wires in the form of lines 9 to an output potential area 12. A gradient coil, for instance, not shown, of the medical equipment is connected to the output potential area.

The first diode chip 3, whose cathode is soldered to the output potential area 12, is provided for the sake of current recovery by the gradient coil. An anode of the first diode chip 3 is connected to the negative potential area 7 by a plurality of lines 10, likewise in the form of tiny bond wires. The first diode chip 3 will be called the first recovery diode chip belonging to the first transistor chip 2, or the first recovery diode chip.

In addition to the first diode chip 3, the second transistor chip 4 is soldered with a collector to the output potential area 12. An emitter of the second transistor chip 4, like the anode of the first diode chip 3, is connected to the negative potential area 7 by lines 11. Further lines 13 connect the emitter of the second transistor chip 4 to the anode of the first diode chip 3. The output potential area 12 is also connected by lines 15 to an anode of the second diode chip 5, whose cathode is soldered to the positive potential area 8 and which forms the recovery diode associated with the second transistor chip 4, or the second recovery diode chip.

Thus each transistor chip 2, 4 and the associated recovery diode chip 3, 5 is located on different potential areas 12, 8. Conversely, each antiparallel diode chip 5, 3 of a transistor chip 2, 4 is disposed jointly with that transistor chip 2, 4 on the same potential area 8, 12.

The transistor chips 2, 4, like the diode chips 3, 5 that are smaller by comparison to them, are approximately square. The width and height of the transistor chips 2, 4 are indicated by $B_T$ and $H_T$, respectively, and the width and height of the diode chips 3, 5 are indicated by $B_D$ and $H_D$, respectively. The surface of the circuit substrate 6 is for the most part filled by the potential areas 7, 8, 12 shown schematically in FIG. 2. The height of the potential areas 7, 8, 12 is indicated by the symbols $H_{P7}$, $H_{P8}$, and $H_{P12}$, respectively.

While the positive potential area 8 already has a rectangular basic shape because of a corresponding copper layer on the circuit substrate 6, a copper layer forming the negative potential area 7 has a U shape; with a middle bar of the U, oriented toward the positive potential area 8, being a known as a connecting cross-member 14. Between the three members of the U is the output potential area 12, whose spacing $D_P$ from the positive potential area 8 is less than the height $H_T$ of the transistor chips 2, 4 and less than the height $H_D$ of the diode chips 3, 5. Between the outer members of the U, the lines 10, 11, 13 extend essentially parallel to the connecting cross-member 14. These lines 10, 11, 13 approach a face, spaced apart parallel from the output potential area 12, in a plane E2 that effectively enlarges the negative potential area 7, so that the negative potential area overall has a shape and size comparable to the positive potential area 8.

An effective negative potential area 7 is thus formed both by the DCB (direct copper bonded) layout and by the tiny bond wires or lines 10, 11, 13. The large potential areas 7, 8, 12 located close together or one above the other, along with the relatively short embodiment of the lines 9, 10, 11, 13, 15 contribute to a low stray inductance of the transistor module 1, and magnetic fields may largely cancel one another out.

The spacing $D_B$ between the first transistor chip 2 and the antiparallel diode chip 5, in the embodiment shown, is less than the spacing $D_H$ between the first transistor chip 2 and the associated recovery diode chip 3; this latter spacing $D_H$ is approximately equivalent to the height $H_D$ of the diode chip 5. The same is analogously true for the second transistor chip 4 and the recovery diode chip 5 associated with the second transistor chip 4 and for the chip 3 anti-parallel to it.

The transistor chips 2, 4 on the one hand and the diode chips 3, 5 on the other hand are thus disposed in a cross-shaped pattern on the circuit substrate 6; each transistor chip 2, 4 disposed on one potential area 12, 8 is located opposite the associated recovery diode chip 3, 5 disposed on the other potential area 8, 12 and is adjacent to the antiparallel diode chip 5, 3.

Figure 3:
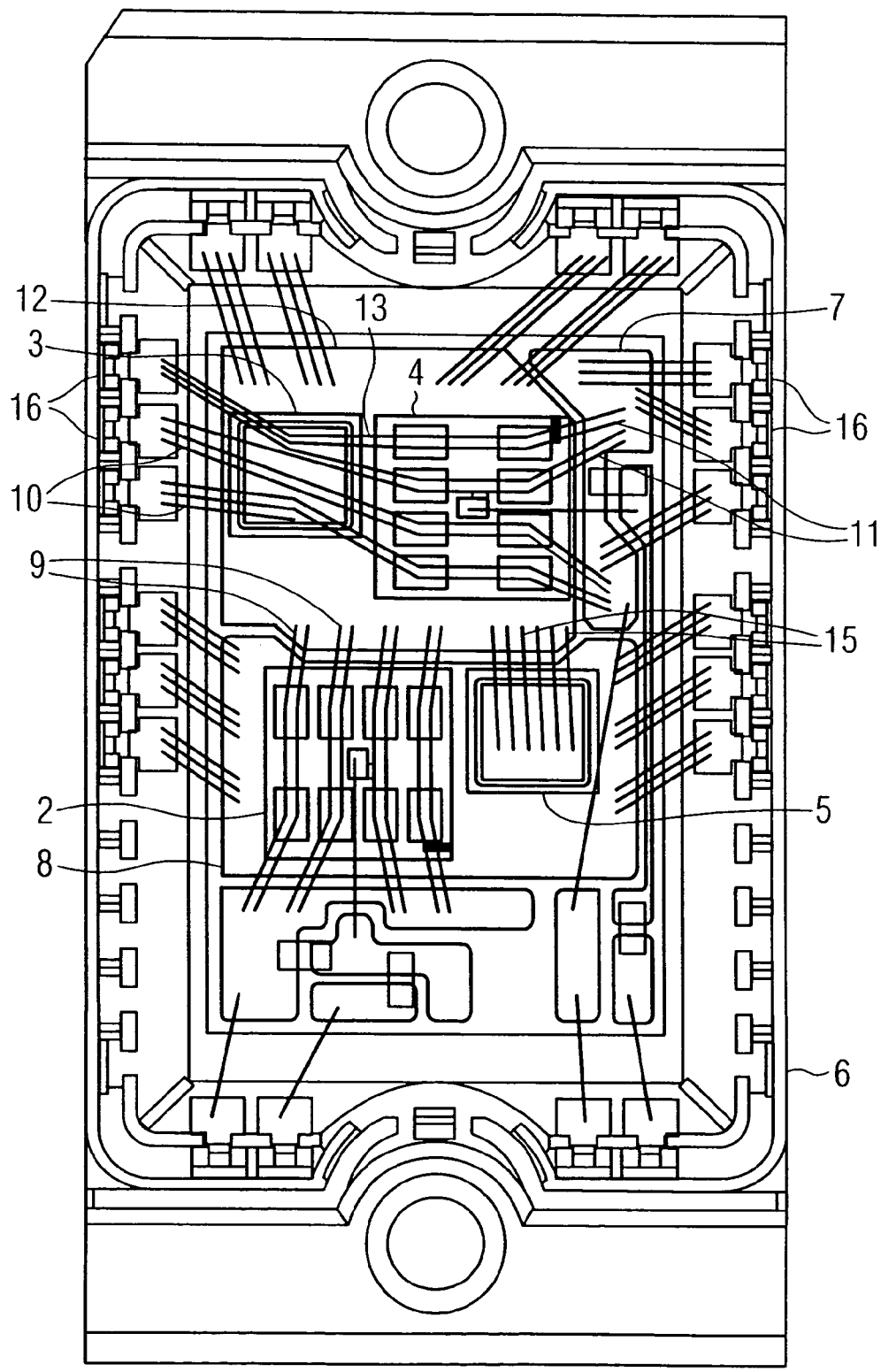
FIG. 3 is a schematic illustrating another embodiment of a transistor module.

In FIG. 3, another embodiment of a transistor module 1 is shown, which is likewise distinguished by a relatively low-inductance construction. In this other embodiment, the negative potential area 7, to the extent that it is not simulated by the lines 10, 11, 13, is present solely in the form of partial areas, which are partly degraded into connection pieces 16 that are not necessarily disposed in the plane E1 of the circuit substrate 6.

The chips 3, 4 on the negative potential area 7 are thus connectable directly to the connection pieces 16. A partial area, adjoining the output potential area 12 on the right in the drawing, of the negative potential area 7, adjacent to the second transistor chip 4, represents a simplification in terms of production, since corresponding tiny bond wires may simply be cut to length.

Despite the substantially reduced size, compared to the illustrating embodiment of FIGS. 1a, 1b and 2, of the part of the negative potential area 7 formed by the DCB layout, the negative potential area is also, in the exemplary embodiment of FIG. 3 as well, formed primarily by the tiny bond wires or lines 10, 11, 13 disposed above the output potential area 12, approximately in the plane E2, so that the overall stray inductance is relatively quite low. A construction of the transistor module 1 that both has a substantially lower inductance and is substantially more compact is attained in particular also by the elimination of a connecting cross-member of the negative potential area 7, which cross-member would be located between the positive potential area 8 and the output potential area 12.

Other relative sizes, positions and areas may be used for any of the embodiments discussed above.

What is claimed is:

1. A transistor module on a substrate, the transistor module comprising:
    a first transistor;
    a first recovery diode;
    a second transistor; and
    a second recovery diode,
    wherein a first transistor chip associated with the first transistor and a second diode chip associated with the second recovery diode are disposed adjacently on a positive potential area, the first transistor chip and the second diode chip being disposed on an output potential area,
    wherein a second transistor chip associated with the second transistor and a first diode chip associated with the first recovery diode are adjacently disposed on the output potential area,
    wherein at least two sides of the output potential area are adjacent to a negative potential area,
    wherein both the second transistor chip and the first diode chip are connected to the negative potential area, and
    wherein one of the first and second transistor chips is disposed adjacent to one of the second and first diode chips on a same potential area and the one of the first and second transistor chips is also disposed opposite another one of the first and second diode chips located on a different potential area.

2. The transistor module of claim 1, wherein a first set of lines connecting both the first diode chip and the second transistor chip to the negative potential area extend at least substantially transversely to a second set of wire lines connecting both the first transistor chip and the second diode chip to the output potential area.

3. The transistor module of claim 2, wherein the negative potential area is connected to both the first diode chip and the second transistor chip by a third set and a fourth set of wire lines, respectively.

4. The transistor module of claim 1, wherein a first spacing separating one of the transistor chips from one of the diode chips disposed on a similar potential area is less than a width of one of the transistor chips.

5. The transistor module of claim 1, wherein a second spacing between one of the transistor chips and one of the diode chips oppositely disposed on separate potential areas is less than a height of one of the transistor chips.

6. The transistor module of claim 1, wherein a third spacing between the positive potential area and the output potential area is less than a height of one of the diode chips.

7. The transistor module of claim 1, wherein a connecting cross-member of the negative potential area is disposed between the positive potential area and the output potential area.

8. The transistor module of claim 1, wherein the output potential area is immediately adjacent the positive potential area.

9. The transistor module of claim 1, wherein the positive potential area and the output potential area are disposed in a same plane.

10. The transistor module of claim 3 wherein a first spacing separating one of the transistor chips from one of the diode chips disposed on a similar potential area is less than a width of one of the transistor chips;
    wherein a second spacing between one of the transistor chips and one of the diode chips oppositely disposed on separate potential areas is less than a height of one of the transistor chips; and
    wherein a third spacing between the positive potential area and the output potential area is less than a height of one of the diode chips.

11. The transistor module of claim 10 wherein the output potential area is immediately adjacent the positive potential area.

12. The transistor module of claim 10, wherein the positive potential area and the output potential area are disposed in a same plane.

* * * * *